July 24, 1962 M. P. SCHMIDT 3,046,124
PROCESS FOR THE MANUFACTURE OF PRINTING PLATES AND LIGHT-SENSITIVE MATERIAL SUITABLE FOR USE THEREIN
Filed March 3, 1958
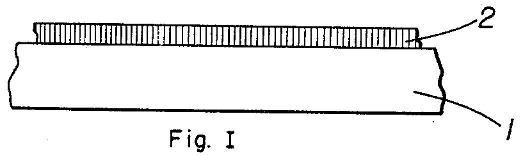
Fig. I
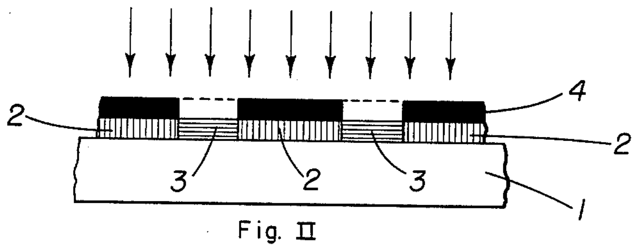
Fig. II
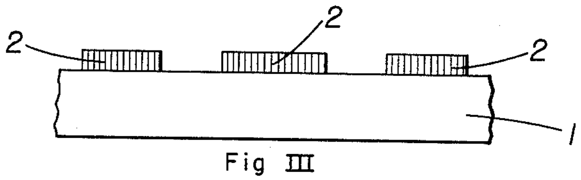
Fig III
Inventor
MAXIMILIAN P. SCHMIDT
By Karl Huber
James E. Bryan
Attorneys 3,046,124

PROCESS FOR THE MANUFACTURE OF PRINTING PLATES AND LIGHT-SENSITIVE MATERIAL SUITABLE FOR USE THEREIN

Maximilian Paul Schmidt, Wiesbaden-Biebrich, Germany, assignor, by mesne assignments, to Azoplate Corporation, Murray Hill, N.J.

Filed Mar. 3, 1958, Ser. No. 718,712
Claims priority, application Germany July 23, 1949
34 Claims. (Cl. 96—33)

The present invention relates to the production of light-sensitive materials suitable for use in the graphic art. More particularly, it relates to a photomechanical method for the manufacture of printing plates and to light-sensitive material suitable for use in the said method.

It has often been proposed to use light-sensitive diazo compounds for the manufacture of copies suitable for the production of reproductions in the graphic art. One of these methods is characterized by the following features: A thin coating comprising colloidal substances in combination with the light-sensitive diazo compounds is produced on a suitable support (carrier base) and, after the coating has been exposed to light under a pattern, the material is transformed into a printing plate suitable for intaglio printing and flat printing respectively just in the same manner as chromate containing layers. In another method the collodial substances are omitted and the diazo compounds, chiefly water-soluble diazo compounds, are applied to a suitable support either alone or in combination with azo components. Supports, which can be used in the above mentioned methods of manufacture are, for example, metal foils, such as foils of aluminium, of aluminium superficially oxydized and of zinc.

Water soluble diazo compounds of high molecular weight have proved themselves particularly suited for a negative working process. On exposure to light under a pattern all areas of the light-sensitive layer struck by light rays are transformed into greasy ink receptive products insoluble in water. Immediately after washing the copies thus obtained with water, prints can be made by means of these copies.

If it is intended to produce with the aid of a positive working process copies suitable for making prints, diazo compounds are used, which are not so complicated, as to their chemical constitution, as the above mentioned diazo compounds. For example, p-dimethylamino-benzene-diazonium salts can be used in combination or not with an azo component. Whereas the exposed material in the above mentioned negatively working process must only be washed, the copies obtained in the positively working process are treated with an alkali, such as ammonia, or with a suitable alkaline developer containing the coupler, if the coupling component has not yet been incorporated into the light-sensitive layer.

In Example 7 of the French Patent 904,255 a process has been described in which 2-diazo-naphthol-(1)-5-sulfonic acid ethyl ester has been used as light-sensitive substance the development of the exposed layer being effected by means of water. This process, however, does not afford usable printing plates.

One subject of the present invention is a process for the manufacture of copies which, in the first line and with outstanding advantage, are intended to be used as printing plates in the graphic art. The new process comprises the following steps:

A suitable support (carrier base) is provided with a light-sensitive coating using as substances causing the light-sensitivity diazo compounds which are derivatives of 2-diazo-naphthol-(1) and 1-diazo-naphthol-(2) and are formed by amidation of a sulfonic acid of the above mentioned diazo-naphthols.

The light-sensitive layer thus produced is exposed to light under a pattern, the exposed layer is treated with an alkali and then rubbed in with greasy ink.

Often it may be advantageous to rewash the printing plate already rubbed in with greasy ink with an alkaline solution.

The compounds heretofore named 2-diazo-naphthol-(1) and 1-diazo-naphthol-(2) are also known in the literature under the designations of naphthoquinone-(1,2)-diazide-(2) and naphthoquinone-(1,2)-diazide-(1) (see Beilstein, "Handbuch der organischen Chemie," 4th edition, volume 16 (1953), pages 533–534). Diazonaphthols are to be considered as the anhydrides of hydroxy-naphthalene-diazohydroxides; see Beilstein loc. cit., page 520.

The diazo compounds which are to be used according to this invention for the production of the light-sensitive coating on the support are insoluble in water, weak alkalies and acids; they are soluble in certain organic solvents or in mixtures of organic solvents. If the diazo compounds in question are struck by light, they are transformed into substances (light-decomposition products) which dissolve in an aqueous medium having alkaline reaction.

The coating which has been exposed to light under a pattern is treated with alkaline solutions, because the light-decomposition products produced in the course of the exposure are to be removed. Suitable supports on which the light-sensitive coating can be applied are, for example, the members of the group consisting of metal foils or metal plates, particularly such as zinc, or aluminium, glass plates and stone plates.

The process of the present invention as described above leads to printing plates on which the areas which have not been struck by light during the exposure of the light-sensitive coating under a transparent pattern and correspond with the density areas of the pattern are not changed by the treatment with alkali; the unaltered areas are receptive for greasy ink. The terms "imaged areas" and "non-imaged areas" are used hereinafter to refer to those areas of the coating layer which are not struck by light and those areas which are struck by light, respectively. Thus, the "imaged areas" are those areas of the coating layer protected from light during exposure by the density areas of the pattern. From this circumstance it is to be seen that on exposure under a positive pattern a positive printing plate is obtained from which positive prints may be drawn, whereas from an exposure under a negative pattern negative printing plates result and likewise negative prints can be made. The invention is illustrated by the accompanying figures:

FIG. 1 represents the support 1 which is covered by the light-sensitive layer 2, FIG. 2 shows the material represented in FIG. 1, after it has been exposed to light under a pattern. 1 designates the support, 4 the density areas of the pattern. The areas of the light-sensitive layer which have not been struck by light and are unchanged—(i.e. the imaged areas)—have been numbered by 2, whereas the number 3 designates the areas of the formerly light-sensitive layer which have been struck by light and in which the diazo compound has been transformed into a light-decomposition product—(i.e. the non-imaged areas), FIG. 3 illustrates the exposed material as shown in FIG. 2 after it has been treated with alkali. The support 1 is only covered by the imaged areas 2 not struck by light during the exposure. These areas designated by the number 2 are greasy ink-receptive and form, together with the support, the printing plate.

The advantages of the present invention are elucidated by the following facts: The composition of the light-sensitive layers as well as of the light-sensitive material is very simple, the light-sensitive layers are positively working ones, their development to the final stage (printing plates) is likewise very simple. In the necessary development azo coupling components are superfluous.

Diazo compounds suitable for the purpose of the present invention are amides of diazo-naphtholsulfonic acids corresponding with the general formula:

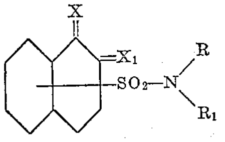

in which X and $X_1$ are $N_2$ or O and are different from each other, R and $R_1$ are hydrogen, alkyl, substituted alkyl, aryl, substituted aryl, aralkyl, alkaryl, or heterocyclic radicals, at least one of R and $R_1$ being other than hydrogen, and R and $R_1$ taken together form a heterocyclic ring.

The following compounds which are referred to in the following examples, represent diazo compounds which are useful according to the present invention:

Formula 1

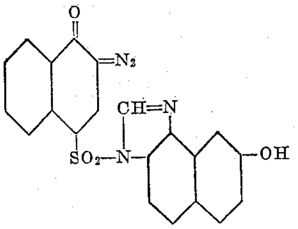

Formula 2

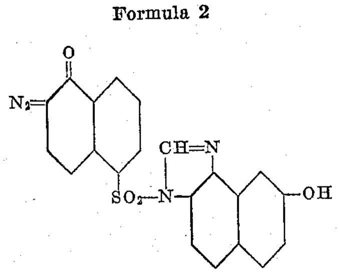

Formula 3

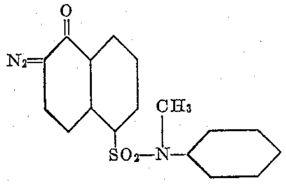

Formula 4

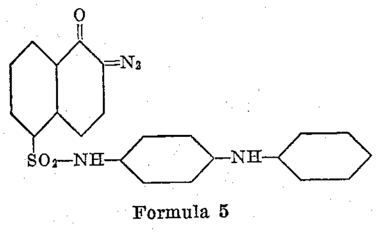

Formula 5

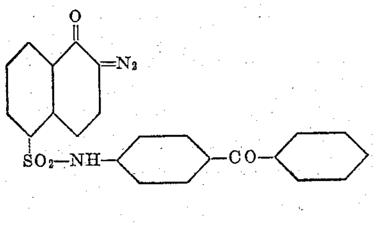

Formula 6

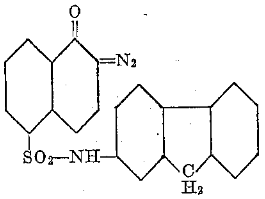

Formula 7

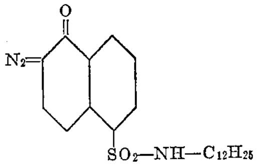

Formula 8

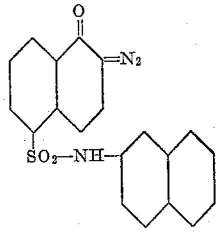

Formula 9

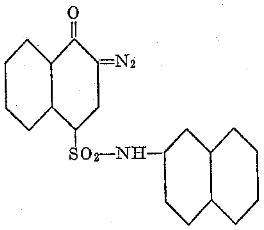

Formula 10

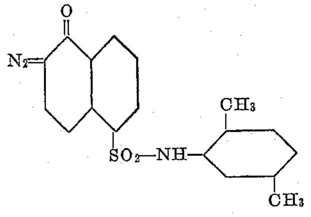

Formula 11

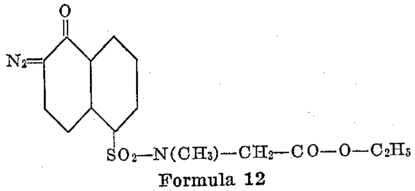

Formula 12

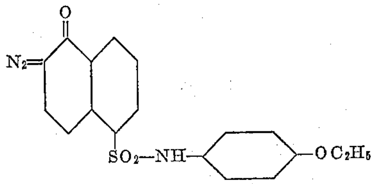

Formula 13

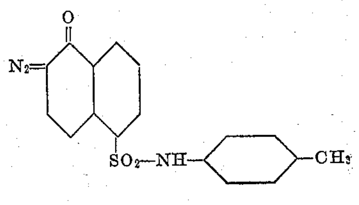

Formula 14

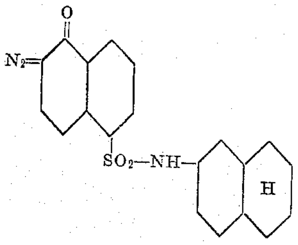

Formula 15

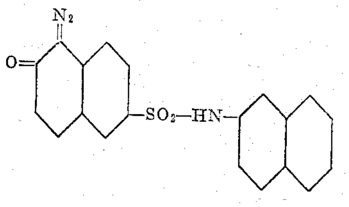

Formula 16

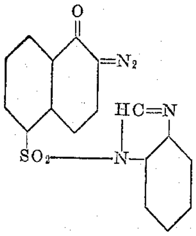

Formula 17

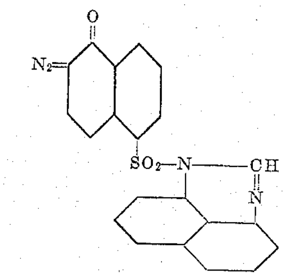

Formula 18

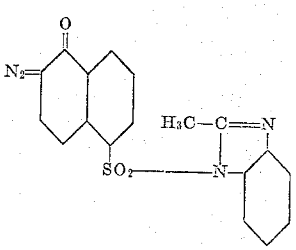

Formula 19

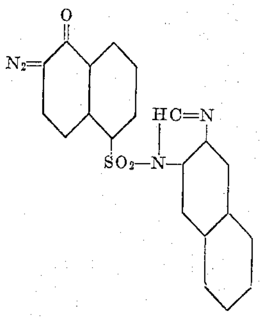

Formula 20

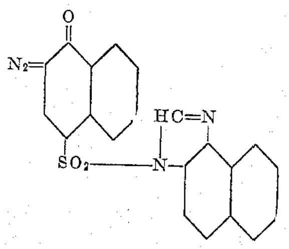

Formula 21

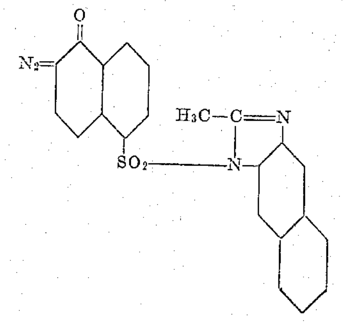

Most of the diazo compounds to be used according to this invention have not been described in the literature until now. They can be prepared without difficulty according to well-known methods of chemical synthesis, for example, by reacting the chlorides of sulfonic acids of 2-diazo-naphthol-(1)- and 1-diazo-naphthol-(2) respectively with organic amino-compounds. Thus aromatic amino-compounds which may be substituted in the nucleus by halogen atoms or by alkyl or alkoxy or aryloxy or alkylmercapto or arylmercapto or nitro or acyl-amino groups or may be hydrogenated are condensed with the sulfo-chlorides of the 2-diazo-naphthol-(1)-sulfonic acids and the 1-diazo-naphthol-(2)-sulfonic acids respectively. The sulfochlorides in question are readily obtainable by causing chlorosulfonic acid to act upon the above named diazo-naphthol-sulfonic acids at about 50 to 70° C. The condensation of the components is effected advantageously in an aqueous weakly alkaline solution containing soda or a caustic alkali. For this purpose the alkaline substance is gradually added to the mixture of the diazo sulfochlorides with the amino-compounds. Sometimes it is advisable to add a suitable organic solvent.

As amines, for example, primary and secondary amines chiefly of aromatic character which may contain in the nucleus substituents, such as halogen atoms or alkyloxy groups, can be used as reaction components. N-methylaniline, N-ethylnaphthylamine, 2,4-dichloroaniline, p-phenetidine, p-aminodiphenylamine, aminofluorene, amino-diphenylenoxide, dodecylamine are mentioned as representatives of this class.

Generally speaking the bigger the molecules of the amines condensed with the diazo-phenol-sulfonic acid chloride are, the better suited for the purpose of the present invention are the sulfonamides obtained. Preference should be given to secondary amines, because there is a bigger difference between sulfonamides obtained with secondary amines and the light-decomposition products thereof as to their behaviour against alkalies than between the sulfonamides obtained with primary amines and the light-decomposition products thereof. Moreover, the images which are produced with the aid of light-sensitive layers containing a diazo compound prepared with a secondary amine are more greasy ink-receptive.

In fact the high-molecular diazo compounds according to the present invention fade better under the influence of light, untinted printing plates being the result. The fading of the diazo compounds can be promoted by the cautious addition of suitable substances to the light-sensitive layer, such as thiourea, thiosinamine and organic acids or dyestuffs having a sensitizing action or improving the visibility of the images can also be added. It will be worthwhile to disregard the use of diazo compounds which do not readily fade.

For the production of the light-sensitive material the diazo compound dissolved in an organic solvent, such as benzene or alcohol, is applied onto a support, for example a superficially oxidized aluminium foil, a thin layer being formed. It is important to produce a uniform and even light-sensitive layer of the diazo compounds on the layer and this can be realized advantageously by using solvents or mixtures of solvents which do not vaporize in a short time. Occasionally very good results as to the production of an uninterrupted strongly coherent layer very well sticking to the support are obtained by using a mixture of several different diazo compounds. Solutions which contain 1 to 3 percent of the diazo compounds are satisfactory for the manufacture of the light-sensitive layer.

The copies which have been obtained by the exposure to light of the coated material under a pattern are developed by means of alkaline solutions as much diluted as possible. Generally aqueous solutions containing 1 to 5 percent of disodium phosphate and trisodium phosphate respectively will be suited. Instead of them dilute solutions of other alkalies, such as soda or caustic soda, can often also be used and solvents, such as alcohol, can be added, if desired. The following data will enable any expert to comply with the requirements of practice: diazonaphtholsulfonamides with both hydrogen atoms of the amido-N-atom substituted can be developed with solutions of trisodium phosphate, diazonaphthol-sulfonamides having an unsubstituted hydrogen atom at the amido-N-atom, however, must be developed with a solution of disodium phosphate. As a rule the weakest alkali suitable for removing the light-decomposition products of the diazo compound should be used. The diazo compounds can be protected against actions coming from the developing alkaline solution by adding readily soluble alkali metal salts, such as sodium chloride, sodium bromide, sodium sulfate to the developer.

The diazo compound images which have been developed on a metal or glass or stone support can be etched by means of acids, even after the images have been rubbed in with greasy ink. In this manner relief printing plates too can be produced.

Another object of the present invention consists in a modification of the above described process. This modification often leads to an improvement of the diazo compounds' power of fixing greasy inks and to an increase of the number of prints which can be produced by means of the printing plates obtained. The modification is characterized by the feature that the light-sensitive diazo compounds are coated onto the support in combination with resins soluble in alkalies or with solid fatty acids or mixtures of resins and fatty acids. Suitable products of this kind are, for example, the resins soluble in alkalies, such as colophony, shellac, and the synthetic resins soluble in alkalies, small quantities of waxes, dyestuffs or resins insoluble in alkalies can be added. The fatty acids suited for the purpose of this invention must be solid and high molecular, such for example as stearic acid.

The quantity of resin and solid fatty acid respectively which is added to the diazo compounds may vary in rather wide limits. Already a quantity amounting to 5 to 10 percent of the quantity of the diazo compound used is very effective. The quantity which is actually added depends on the special diazo compound used for the production of the light-sensitive layer.

This modification of the invention as described is accessible to another modification which shall be explained as follows:

The support (carrier base) before being coated with the solution of the light-sensitive diazo compound is covered with a layer which is produced using resins soluble in alkalies or fatty acids or synthetic resins with or without a small addition of waxes or dyestuffs or resins insoluble in alkalies. The diazo compound solution is then applied onto this layer and, after drying, the light-sensitive material is proceeded with as described above. After the exposure to light the material is developed by means of an aqueous alkaline solution in order to remove the light-decomposition products of the diazo compound and now at all areas struck by light also the layer which had been applied as the base layer is removed. The base layer, however, remains unchanged in all areas not struck by light, i.e. in the areas forming the image. Using the images thus obtained as printing plates in the graphic art, excellent results can be reached. Often the result can still be improved, if the material, after it has been exposed to light under a pattern, is subjected to a heat treatment or if it is heated, after the development with alkali has been executed as described above. If this modification of the invention consisting in the application of a base layer onto the support is proceeded with, the resin or fatty acid must not necessarily be added to the solution of the diazo compound. Material covered with a base coating consisting of resins soluble in alkalies or high molecular fatty acids and a surface coating consisting of the diazo compounds here in question can be transformed into excellent printing plates of outstanding quality.

One more object of the present invention is to be seen in a modificaiton of the process as follows:

As soon as the light-sensitive material has been exposed to light under a pattern, preferably a positive pattern, it is subjected to the influence of raised temperature, for example by heating it with a flame. This heat-treatment is continued, until the weakly colored copy gets darker and accepts a grayish shade. The copy is then treated with the solution of an alkali in order to remove the light-decomposition products of the diazo compound. After washing with water, the copy is ready for use as printing plate and the plate can be clamped to the printing machine.

It is possible to wash out the light-decomposition product, before the copy is subjected to the heat treatment. The previous washing out of the light-decomposition products before heating the copy is the better way. After the copy has been heated it can be treated once more with an alkaline solution somewhat stronger than the alakaline solution for the first alkaline treatment. This second treatment with alkali is intended to remove remainders of the light-decomposition products if any. Then the copy is rubbed in with greasy ink.

Instead of heating the exposed material with a flame, it can be heat-treated in an adequate manner by means of a hot flatiron or by means of heated cylinders or by leaving the material for some time in an electrically heated closed chamber. Under the influence of heat the diazo compound is decomposed and the heat-decomposition product is strongly bonded to the support. After the complete removal of the light-decomposition products etching of the heated copy is possible and clichés can thus be manufactured.

In some cases the printing plates which have been manufactured without the addition of resins or fatty acids are fit for the production of only a relatively small number of prints. This circumstance can probably be explained as follows: Some of the diazo compounds to be used according to this invention stick badly to the support if applied without additional substances. When exposed to the strains connected with the printing operation they lose the connection with the support very soon. Generally this disadvantage can be cured by a heat-treatment of the copy as described above.

The observations which could be made are believed to entitle to the conclusion that those diazo compounds into which only a small residue is introduced by means of the amidation process have a bad connection to the support. Diazo compounds in which the said residue is a bigger one and has an annular constitution stick per se much better to their support and afford printing plates of a long life-time without the addition of resins or fatty acids.

A further improvement of the sticking of the greasy ink to the developed printing plates can be reached, if the developed copies, after being rubbed in with greasy ink, are stored for some time, before the printing operation is started. A similar proposal has already been made with respect to printing plates containing bichromates.

The plates and foils serving as support for the light-sensitive layer can be coated on an industrial scale in view of the excellent stability of the light-sensitive layers. An enormous progress in the graphic art and an unexpected facility for the lithographer has been realized by the present invention.

The following examples are inserted merely for the purpose of illustrating the above described process without any intention of restricting the scope of the invention.

(1) A 2% solution of the condensation product of 1 mol of 7′-hydroxy-1′,2′:4,5-naphthoimidazole and 1 mol of 2-diazo-naphthol-(1)-4-sulfochloride (Formula 1) in dioxane (diethylenedioxide) is spread upon a superficially oxidized aluminium foil by means of a plate-whirler making 100 revolutions per minute. Instead of the heretofore stated solution a 2% solution of the condensation product of 7′-hydroxy-1,2-naphtho-imidazole and 1 mol of 2-diazo-naphthol-(1)-5-sulfochloride (Formula 2) in dioxane can be used with the same success. After drying by means of hot air (fan), the layer is exposed to light under a positive pattern, after the pattern has been removed, treated with a 3 to 5% trisodium phosphate solution and rinsed with water. Then the foil is well dried with a fan, treated with a 5% phosphoric acid solution as usual and rubbed in with black greasy ink. The yellow diazo image is blackened in this manner. After rinsing with water, the foil in wet state is clamped to the printing apparatus. A modification of the proceeding as described heretofore consists in clamping the printing plate, after it has been treated with acid and rinsed with water, to the printing machine and then rubbing it in with black greasy ink and printing.

As it is often done in practice, the image, after having been treated with an acid and blackened with greasy ink is rubbed in with a weakly acid dextrin solution, thoroughly dried and stored for some time. After washing with water, the printing plate is used in a printing machine and from a positive pattern very good positive prints are obtained.

The compound corresponding with Formula 1 is prepared as follows:

The solution of 1.84 grams of 7′-hydroxy-naphtho-1′,2′:4,5-imidazole in a mixture of 20 cc. of dioxane with 15 cc. of water is mixed with the solution of 2.7 grams of naphthoquinone-(1,2)-diazide-(2)-4 - sulfochloride in 25 cc. of dioxane. After 12 cc. of a 10% sodium carbonate solution have been added slowly to the mixture while gently heating, a small quantity of hot water is added to the reaction mixture before cooling it. The reaction product separates out and is filtered off by suction, frequently washed with water and dried. It is purified by dissolving it in a mixture of 25 parts by volume of dioxane and 1 part by volume of ethyl alcohol. The solution is filtered and mixed with some water. Thus the reaction product is again separated and then filtered by suction, washed with water and dried. It melts at 270–275° with decomposition.

The compound corresponding with Formula 2 is produced by adding 2.7 grams of naphthoquinone-(1,2)-diazide-(2)-5-sulfochloride to the cold solution of 3.7 grams of 7′-hydroxy-naphtho-1′,2′:4,5-imidazole in 300 cc. of dioxane and heating the mixture for about 10 minutes on a steam bath. The reaction mixture after standing over night is filtered by suction and the filtrate is poured into one liter of water which had been mixed with some hydrochloric acid. A yellow product is separated, filtered by suction, washed with water and after drying recrystallized from ethyl alcohol.

(2) A mixture consisting of 1 part by weight of the condensation product of the sulfochloride of naphthoquinone-(1,2)-diazide-(2)-5-sulfonic acid and 2,4-dichlorophenol and 1 part by weight of the condensation product of the sulfochloride of the same sulfonic acid and N-methylaniline (Formula 3) is dissolved in 100 parts by volume of a mixture consisting of 3 parts of dioxane and 1 part of alcohol. The solution is plate-whirled onto a superficially oxidized aluminium plate and dried. After it has been exposed to light under a positive, it is developed with a 5% disodium phosphate solution. Then it is made ready for use as a printing plate.

For the preparation of the naphthoquinone-(1,2)-diazide-(2)-5-sulfonic acid-N-methylanilide 5.5 parts by weight of the sulfochloride of the naphthoquinone-(1,2)-diazide-(2)-5-sulfonic acid are dissolved in 100 parts by volume of methanol and the solution is then mixed with a solution of 4.5 parts by weight of monomethylaniline in methanol. The mixture obtained is heated to boiling for some time and then cooled down. The diazo compound separates in form of crystals and is filtered by suction, washed with water, dried and recrystallized from methanol. The orange-yellow crystals decompose at 157° C.

(3) A 2% dioxane-alcohol solution of the condensation product of naphthoquinone-(1,2)-diazide-(2)-5-sulfochloride and p-aminodiphenylamine (Formula 4) which has been prepared by a condensing action in benzene and decomposes at about 230° C. is plate whirled onto a superficially oxidized aluminium plate. After drying and exposing the plate under a positive, the plate is developed using a 10% disodium phosphate solution and washed with water. After drying, the diazo image is wiped over with a solution of acid salts as described, for example, by Strecker in the German Patent No. 642,782, or with a 1% phosphoric acid, treated in the wet state with fatty ink, rinsed with water and dried. After it has been stored over night, the printing plate is treated with phosphoric acid once more, washed with water and used for printing in a printing machine.

(4) A 2% solution of the condensation product of naphthoquinone-(1,2)-diazide-(2)-5-sulfochloride and 4-aminobenzophenone (Formula 5) is prepared with the aid of a mixture consisting of methylethylketone and glycolmonomethylether 1:1. This solution is used for coating a superficially oxidized aluminium plate. After exposure to light under a positive pattern the layer is treated with a 10% disodium phosphate solution and washed with water. The positive diazo image, after it has been freed of the light-decomposition products, is dried and wiped over with a 1% phosphoric acid; finally it is rubbed in with greasy ink. The printing plate thus obtained can at once be used for making prints.

(5) In a similar manner a printing plate can be manufactured using the condensation product of naphthoquinone-(1,2)-diazide-(2)-5-sulfochloride and 2-aminofluorene (Formula 6). In this case the development is performed by means of a 3% trisodium phosphate solution and a 2.5% soda solution respectively.

The compound of Formula 6 is prepared in the following manner:

1.8 grams of 2-amino-fluorene are dissolved in a mixture consisting of 20 cc. of dioxane and 10 cc. of water. To said mixture there are added at room temperature the solution of 3 grams of naphthoquinone-(1,2)-diazide-(2)-5-sulfochloride in 20 cc. of dioxane and subsequently slowly 12 cc. of a 10% sodium carbonate solution. The mixture is heated on a steam bath to about 60° C., mixed with some cold water and cooled down. After cooling the reaction product which has separated is filtered off by suction and dried. On heating up to 300° it does not decompose and melt.

(6) For coating a superficially oxidized aluminium plate a 2% solution of naphthoquinone-(1,2)-diazide-(2)-5-sulfonic acid-dodecylamide (Formula 7) in a mixture of dioxane and methyl-ethylketone 1:1 is used. After exposure under a positive pattern the layer is developed with a mixture consisting of 3 parts of a 10% disodium phosphate and 1 part of a 3% trisodium phosphate solution and subsequently washed with water. The positive diazo image is rubbed in with greasy ink after being treated with an acid in the usual manner. The positive printing plate thus obtained can be used for making prints immediately after the plate has been rinsed with water.

Naphthoquinone-(1,2)-diazide-(2)-5-sulfonic acid dodecylamide is prepared as follows: 13.4 grams of the sulfochloride of naphthoquinone-(1,2)-diazide-(2) - 5 - sulfonic acid are dissolved in 100 cc. of hot benzene. The solution is filtered and 18.3 grams of dodecylamine are added, leading to an exothermic reaction. Apart from a small remainder the benzene is evaporated by gentle heating. After a short time the reaction product begins to precipitate in dark-colored crystals which are separated from the liquor by decanting and the residuum is dissolved in warmed alcohol and filtered with addition of some charcoal. The diazo sulfonamide crystallizes out, it melts at 118° C. under decomposition and corresponds with the Formula 7.

(7) 2 grams of 2-diazo-naphthol-(1)-5-sulfonic acid-$\beta$-naphthylamide (Formula 8) and 0.2 gram of shellac are dissolved in a mixture consisting of 50 parts by volume of dioxane (diethylenedioxide) and 50 parts by volume of alcohol. Instead of 2-diazo-naphthol-(1)-5-sulfonic acid-$\beta$-naphthylamide the 4-sulfon-$\beta$-naphthylamide of the same diazo-naphthol (Formula 9) can be used. The solution is applied in the usual manner onto a superficially oxidized aluminium foil or zinc plate so as to form a thin layer and after drying this light-sensitive layer is exposed to light under a positive pattern. The exposed layer is then washed out with a 5% solution of disodium phosphate with the aid of a cotton swab, rinsed with water and dried. After drying, the material is treated with a solution of acid salts as described, for example, by Strecker in the German Patent No. 642,782, and the positive image is developed with greasy inks.

The shellac may be replaced by the same quantity of colophony.

For the production of the 2-diazo-naphthol-(1)-5-sulfonic acid-$\beta$-naphthylamide 2 mols of $\beta$-naphthylamine dissolved in warmed benzene are added to a heated solution of 1 mol of 2-diazo-naphthol-(1)-5-sulfochloride in benzene. After the reaction mixture has cooled down, the 2-diazo-naphthol-(1)-5-sulfonic acid - $\beta$ - naphthylamide which has separated out is removed together with the naphthylamine hydrochloride likewise separated out. The naphthylamine hydrochloride is removed by extracting the precipitation by means of diluted hydrochloric acid and by washing it with water. The 2-diazo-naphthol-(1)-5-sulfonic acid-$\beta$-naphthylamide is recrystallized from benzene in the presence of animal charcoal. The product in a pure condition melts at 144.5° C. under decomposition.

In an analogous manner the isomeric 2-diazo-napthol-(1)-4-sulfonic acid-$\beta$-naphthylamide is prepared. After recrystallization from alcohol this compound melts at 154° C. under decomposition.

(8) A 2% solution of 2-diazo-naphthol-(1)-5-sulfonic acid-$\beta$-naphthylamide which, after recrystallization from benzene, melts at 114.5° C. under decomposition and has the Formula 8 in a mixture of equal parts of dioxane and alcohol is poured upon a superficially oxidized aluminum foil and the surplus of the solution is removed. After drying the light sensitive layer is exposed to light under a positive pattern, until the diazo compound has been destroyed in all areas struck by light. Now the layer is treated with a 5% disodium phosphate solution with the aid of a cotton swab and rinsed with water.

After drying, the foil is heated on its backside by means of a flame, until the yellow positive image gets gray. The heating procedure can also be executed by putting the foil into a drying oven heated to 200° C. to 220° C. Only some minutes are necessary for the heating operation.

Now the surface of the foil covered by the image is treated with a 5% trisodium phosphate solution and can be rubbed in with copying ink while still wet. The foil is then ready for use.

Instead of the above named diazo compound the analogously constituted 2-diazo-naphthol-(1)-5-sulfonic acid-p-xylidid (Formula 10) can be used. This product is prepared by condensing 2-diazo-naphthol-(1)-5-sulfochloride with p-xylidine in benzene. After recrystallization from methanol it melts at 157° C. under decomposition.

(9) To a 2% solution of the ethyl ester of 2-diazo-naphthol-(1)-5-sulfonic acid-sarcosine of the Formula 11 0.2 gram of thiosinamine and 1 gram of benzoic acid are added. A superficially oxidized aluminium foil is coated with the before mentioned solution. After the coated foil has been dried, the light sensitive layer is exposed under a transparent positive and after exposure wiped over with an aqueous 5% disodium phosphate solution. After washing with water the exposed layer is treated with a 0.6% solution of phosphoric acid in water containing 14.0% of gum arabic. Then the layer is inked up and the foil can be used as a printing plate.

(10) A zinc plate which has been pre-treated as usually is coated with a 2% solution of 2-diazo-naphthol-(1)-5-sulfonic acid-p-phenetidide (Formula 12) in a mixture consisting of dioxane and alcohol. The further treatment is the same as that described in Example 8.

(11) 2 grams of 2-diazo-naphthol-(1)-5-sulfonic acid-para-toluidide (Formula 13) together with small quantities of thiosinamine and benzoic acid are dissolved in 100 cc. of a mixture consisting of alcohol and dioxane and are coated in the known manner on a superficially oxidized aluminium foil. The foil is exposed to light under a pattern and is then further treated, as has been described in Example 8.

(12) 5.4 grams (2 moles/100) of naphthoquinone-(1,2)-diazide-(2)-5-sulfochloride are dissolved at raised temperature in 30 cc. of anhydrous benzene. To this solution there is added a solution of 5.9 grams (4 moles/100) of 1,2,3,4-tetrahydro-naphthylamine-(2) in 15 cc. of anhydrous benzene. A brisk reaction occurs and after some minutes the reaction mixture solidifies to form a crystalline mass, which is drawn off and from which the hydrochloride of tetrahydronaphthylamine is then removed by washing with water. The yellow diazo compound corresponding to Formula 14 is recrystallized from methanol and decomposes at 128° C.

A 2% solution of the diazo compound corresponding to Formula 14 in glycolmonomethylether is coated by means of a plate whirler, onto a roughened aluminium foil. After the coated layer is well dried, the foil is exposed to light under a transparent positive pattern. By developing the exposed layer with a 5% disodium phosphate solution, a positive image is obtained, which is then treated with a 0.6% phosphoric acid to which gum arabic was added. After inking with greasy ink, the foil is ready for printing.

(13) A solution of 2.7 grams of naphthoquinone-(1,2)-diazide-(1)-6-sulfochloride in 100 cc. of anhydrous benzene is added to a solution of 2.8 grams of $\beta$-naphthylamine in 20 cc. of anhydrous benzene, and the reaction mixture is heated for one hour to 55–60° C. This mixture is left standing for three days at room temperature. The surplus $\beta$-naphthylamine which crystallizes in the form of its hydrochloride is drawn off, and the filtrate is mixed with petroleum-ether, whereupon the condensation product precipitates as a somewhat brownish mass. It is drawn off and separated from the still adhering $\beta$-naphthyl-amine hydrochloride by treating with water.

The condensation product is dissolved in a dilute caustic soda solution to which some alcohol has been added and is precipitated again from the solution by means of dilute hydrochloric acid. A weakly brown-colored product is obtained, which decomposes at about 115° C. and corresponds to Formula 15.

A 1.5% solution of the compound corresponding to Formula 15 in glycol-monomethyl-ether is coated onto a roughened aluminium foil by means of a plate whirler. The layer thus formed is well dried, and the foil is then exposed for 1–2 minutes under a transparent positive pattern. By developing the exposed foil with a 10% disodium phosphate or a 1% trisodium phosphate solution, a positive image is obtained, which is rinsed with water, wiped over with a 1% phosphoric acid, and inked with greasy ink. The foil is then finished for use in printing.

(14) 5.4 grams of naphthoquinone-(1,2)-diazide-(2)-5-sulfochloride are dissolved in 27 cc. of dioxane and a solution of 4.6 grams of benzimidazole in 23 cc. of dioxane is added. After standing for one day, the reaction mixture is poured into water. Then some diluted hydrochloric acid is added for removing the benzimidazole hydrochloride, and the condensation product is drawn off. It is dried and recrystallized from spirit. When heated, the diazo compound thus formed, and corresponding to Formula 16, decomposes at about 130° C.

A 1.5% solution of the diazo compound corresponding to Formula 16 in glycol-monomethyl-ether is coated onto a superficially oxidized aluminum foil by means of a plate whirler. After the layer is well dried, the foil is exposed to light under a transparent positive pattern. By developing the exposed foil with a 2% soda solution, a positive image is obtained which is then treated with a 3% phosphoric acid solution and rubbed in with greasy ink. The foil is then ready for printing.

(15) 3.4 grams of perimidine are dissolved in 70 cc. of dioxane. To this solution a solution of 2.7 grams of naphthoquinone-(1,2)-diazide-(2)-5-sulfochloride in 15 cc. of dioxane is added. Then the mixture is heated first with 100 cc. of water, strongly acidified with hydrochloric acid, and then poured into water, whereupon the condensation product precipitates. It is drawn off, washed with water, and dried at about 40° C. By recrystallization from alcohol, the condensation product corresponding to Formula 17 is obtained in the form of yellow colored crystals, which decompose at 174° C.

A 1.5% solution of the compound corresponding to Formula 17 in glycol-monomethyl-ether is coated by means of a plate whirler onto a roughened aluminum foil. Exposure of the light sensitive foil is effected under a transparent positive pattern, and the exposed foil is then developed to a positive image by means of a 1% solution of trisodium phosphate. After rinsing the image with water, wiping it over with 1% phosphoric acid, and inking it with greasy ink, the foil can be used for making copies.

(16) 5.4 grams of naphthoquinone-(1,2)-diazide-(2)-5-sulfochloride dissolved in 25 cc. of dioxane are added at room temperature to a solution of 2.6 grams of 2-methylbenzimidazole in a mixture of 30 cc. of dioxane and 10 cc. of water. The mixture is heated to a temperature of about 50° C. and then 25 cc. of a 10% soda solution are slowly added. After a short time, the condensation product precipitates, and by addition of water to the reaction mixture, the condensation product is completely precipitated. It is drawn off, washed with water, and dried. By recrystallization from benzene it is obtained in the form of yellow crystals which, upon heating to 145° C., turn almost black. The condensation product corresponds to Formula 18.

A 1.5% solution of the compound corresponding to Formula 18 in glycol-monomethyl-ether is coated on a roughened aluminum foil by means of a plate whirler. Exposure of the foil takes place under a transparent positive pattern. Development of the exposed foil with a 3% trisodium phosphate leads to a positive image. After rinsing it with water, and wiping over with 1% phosphoric acid, the image is inked with greasy ink, and the foil may then be used for running copies.

(17) The solution of 1.7 grams of naphtho-2',3':4,5-imidazole in a mixture of 10 cc. of dioxane and 5 cc. of water is heated to 30–40° C. and united with a solution of 2.8 grams of naphthoquinone-(1,2)-diazide-(2)-5-sulfochloride in 15 cc. of dioxane having the same temperature. 10 cc. of a 10% soda solution are then added to the reaction mixture. After a short time, the condensation product begins separating. The reaction mixture is then diluted with an equal qnantity of water and acidified. The separated yellow product is drawn off, washed neutral with water, and dried. After recrystallization from an alcohol/dioxane mixture, the compound corresponding to Formula 19 decomposes at about 250° C.

A 1.5% solution of the diazo compound corresponding to Formula 19 in a mixture of equal parts by volume of glycol-monomethyl-ether and dimethyl-formamide is coated on a roughened aluminum foil. After exposing the foil to light under a transparent positive pattern, a positive image is obtained by developing the exposed foil with a 10% disodium phosphate solution. After washing with water, treating with 1% phosphoric acid, and rubbing in with greasy ink, the foil is ready for printing.

(18) A solution of 1.7 grams of naphtho-1',2':4,5-imidazole in 10 cc. of dioxane, and a solution of 2.8 grams of naphthoquinone-(1,2)-diazide-(2)-4-sulfochloride in 15 cc. of dioxane are combined and a 10% soda solution is then added to the reaction mixture. The condensation being finished, the reaction mixture is poured into 150 cc. of acidified water. The precipitated yellow product is drawn off, washed with water, and dried. The compound corresponding to Formula 20 is recrystallized from acetone, and decomposes at a temperature of 210–220° C.

A 1.5% solution of the compound corresponding to Formula 20 in a mixture of equal parts by volume of glycol-monomethyl-ether and dimethyl-formamide is coated on a roughened aluminum foil and dried. After exposure to light of the light sensitive foil under a transparent positive pattern, a positive image is obtained by developing the light-sensitive foil with a 10% disodium phosphate solution. After washing with water, treating with a 1% phosphoric acid, and rubbing with greasy ink, the foil is ready for printing.

(19) A solution of 1.8 grams of 2-methyl-naphtho-2',3':4,5-imidazole in a mixture of 30 cc. of dioxane and 8 cc. of water is mixed with a solution of 2.8 grams of naphthoquinone-(1,2)-diazide-(2)-5-sulfochloride. 15 cc. of a 10% soda solution are added to the reaction mixture and upon heating to about 50° C. the condensation takes place. After the condensation has come to an end, the reaction mixture is poured into 200 cc. of acidified water, whereupon the separated yellow product is drawn off, washed with water, and dried. After recrystallization from a mixture of ethanol and water, the condensation product begins to darken and to sinter when heated to 150° C. and above, but does not show further changes up to a temperature of 265° C. This compound corresponds to Formula 21.

A 1.5% solution of the diazo compound corresponding to Formula 21 in a mixture of equal parts by volume of glycol-monomethyl-ether and dimethyl formamide is coated on a roughened aluminum foil and dried. After exposing the foil to light under a transparent pattern, the exposed foil is developed with a 10% disodium phosphate solution, and a positive printing image is obtained. After washing with water, treating with 1% phosphoric acid, and rubbing in with greasy ink, the foil is ready for printing.

This application is a continuation-in-part of application Serial No. 517,086, filed June 21, 1955, which application is, in turn, a continuation-in-part of application Serial No. 174,556, filed July 18, 1950 and now abandoned.

I claim:

1. A compound having the formula

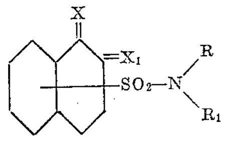

in which X and $X_1$ are selected from the group consisting of $N_2$ and O and are different, R is selected from the group consisting of hydrogen, lower alkyl and groups which together with $R_1$ form a ring selected from the group consisting of an imidazole ring and a pirimidene ring, and $R_1$ is a fused ring aryl group.

2. A compound having the formula

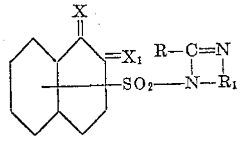

in which X and $X_1$ are selected from the group consisting of $N_2$ and O and are different, R is selected from the group consisting of hydrogen and lower alkyl, and $R_1$ is a fused ring arylene group.

3. A compound having the formula

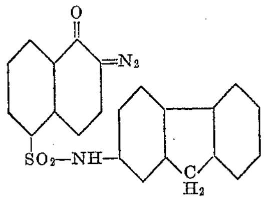

4. A compound having the formula

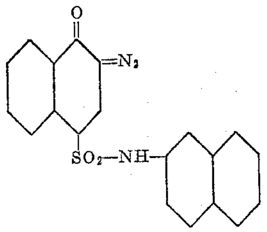

5. A compound having the formula

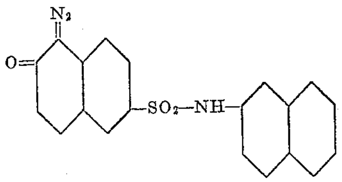

6. A compound having the formula

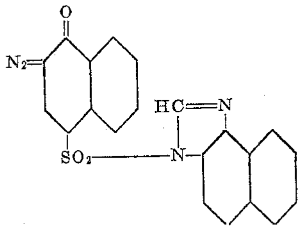

7. A compound having the formula

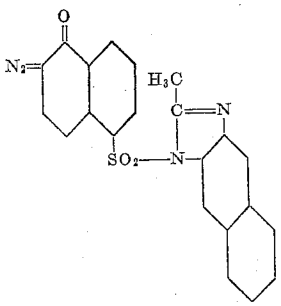

8. A printing plate comprising a base material having printing and non-printing areas thereon, the printing areas comprising a compound having the formula

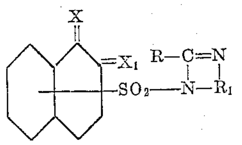

in which X and $X_1$ are selected from the group consisting of $N_2$ and O and are different, R is selected from the group consisting of hydrogen and lower alkyl, and $R_1$ is an arylene group; the non-printing areas comprising base material.

9. A printing plate comprising a base material having printing and non-printing areas thereon, the printing areas comprising a compound having the formula

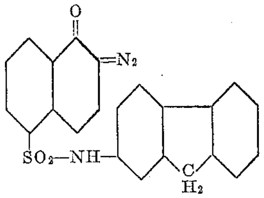

and the non-printing areas comprising the base material.

10. A printing plate comprising a base material having printing and non-printing areas thereon, the printing areas comprising a compound having the formula

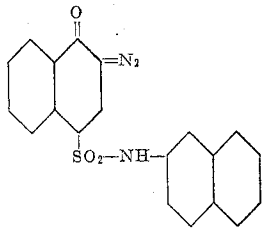

and the non-printing areas comprising the base material.

11. A printing plate comprising a base material having printing and non-printing areas thereon, the printing areas comprising a compound having the formula

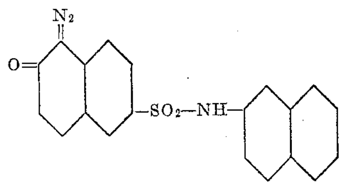

and the non-printing areas comprising the base material.

12. A printing plate comprising a base material having printing and non-printing areas thereon, the printing areas comprising a compound having the formula

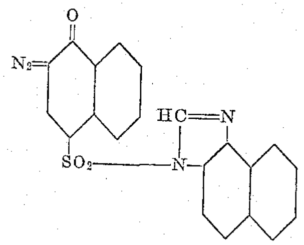

and the non-printing areas comprising the base material.

13. A printing plate comprising a base material having printing and non-printing areas thereon, the printing areas comprising a compound having the formula

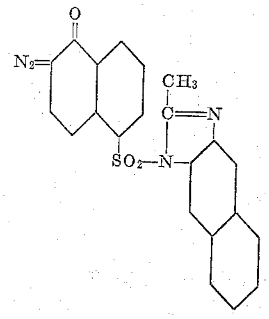

and the non-printing areas comprising the base material.

14. A process for developing a printing plate which comprises exposing to light under a master a plate having a compound thereon of the formula

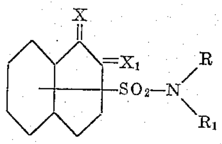

in which X and $X_1$ are selected from the group consist-of $N_2$ and O and are different, R is selected from the group consisting of hydrogen, lower alkyl and groups which together with $R_1$ form a ring selected from the group consisting of an imidazole ring and a primidene ring, and $R_1$ is selected from the group consisting of alkyl an arylene group to thereby form a decomposition product in the light struck areas and removing the decomposition product by treatment with a weakly alkaline solution.

15. A process according to claim 14 in which the compound is in admixture with an alkali-soluble resin.

16. A process for developing a printing plate which comprises exposing to light under a master a plate having a compound thereon of the formula

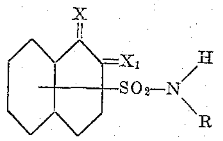

in which X and $X_1$ are selected from the group consisting of $N_2$ and O and are different, and R is an aryl group; to thereby form a decomposition product in the light struck areas and removing the decomposition product by treatment with a weakly alkaline solution.

17. A process for developing a printing plate which comprises exposing to light under a master a plate having a compound thereon of the formula

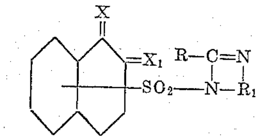

in which X and $X_1$ are selected from the group consisting of $N_2$ and O and are different, R is selected from the group consisting of hydrogen and lower alkyl, and $R_1$ is an arylene group to thereby form a decomposition product in the light struck areas and removing the decomposition product by treatment with a weakly alkaline solution.

18. A process for developing a printing plate which comprises exposing to light under a master a plate having a compound thereon of the formula

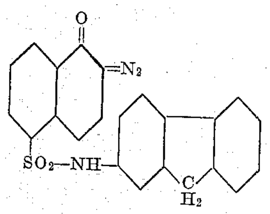

to thereby form a decomposition product in the light struck areas and removing the decomposition product by treatment with a weakly alkaline solution.

19. A process for developing a printing plate which comprises exposing to light under a master a plate having a compound thereon of the formula

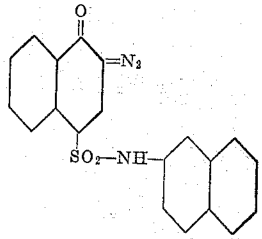

to thereby form a decomposition product in the light struck areas and removing the decomposition product by treatment with a weakly alkaline solution.

20. A process for developing a printing plate which comprises exposing to light under a master a plate having a compound thereon of the formula

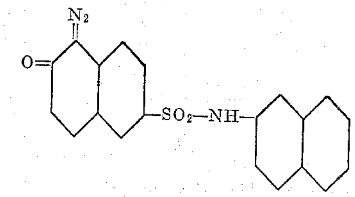

to thereby form a decomposition product in the light struck areas and removing the decomposition product by treatment with a weakly alkaline solution.

21. A process for developing a printing plate which comprises exposing to light under a master a plate having a compound thereon of the formula

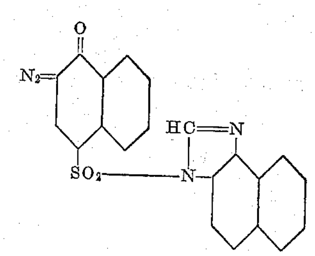

to thereby form a decomposition product in the light struck areas and removing the decomposition product by treatment with a weakly alkaline solution.

22. A process for developing a printing plate which comprises exposing to light under a master a plate having a compound thereon of the formula

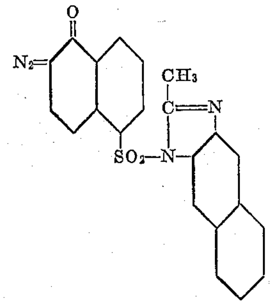

to thereby form a decomposition product in the light struck areas and removing the decomposition product by treatment with a weakly alkaline solution.

23. A compound having the formula

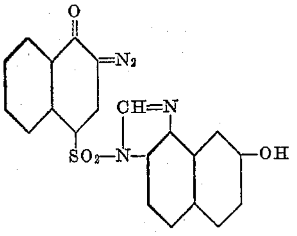

24. A compound having the formula

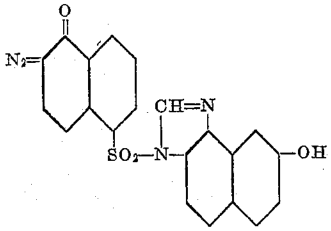

25. A compound having the formula

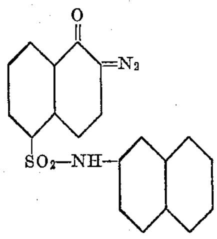

26. A compound having the formula

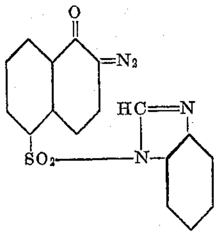

27. A compound having the formula

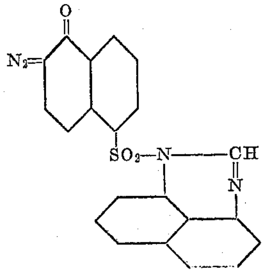

28. A compound having the formula

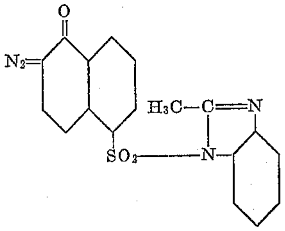

29. A compound having the formula

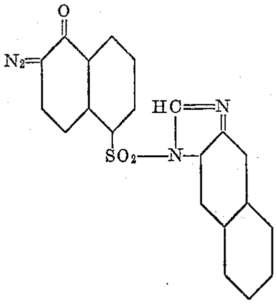

30. A printing plate comprising a base material having printing and non-printing areas thereon, the printing areas comprising a compound having the formula

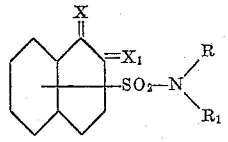

in which X and $X_1$ are selected from the group consisting of $N_2$ and O and are different, R is selected from the group consisting of hydrogen, lower alkyl and groups which together with $R_1$ form a ring selected from the group consisting of an imidazole ring and a pirimidene ring, and $R_1$ is selected from the group consisting of alkyl and aryl groups; the non-printing areas comprising the base material.

31. A printing plate comprising a base material having printing and non-printing areas thereon, the printing areas comprising a compound having the formula

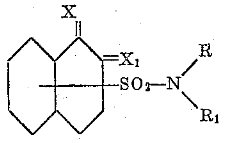

in which X and $X_1$ are selected from the group consisting of $N_2$ and O and are different, R is selected from the group consisting of hydrogen and lower alkyl groups and $R_1$ is an alkyl group; the non-printing areas comprising the base material.

32. A printing plate comprising a base material having printing and non-printing areas thereon, the printing areas comprising a compound having the formula

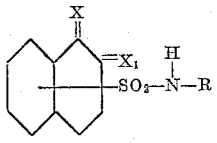

in which X and $X_1$ are selected from the group consisting of $N_2$ and O and are different, and R is an aryl group; the non-printing areas comprising the base material.

33. A process for developing a printing plate which comprises exposing to light under a master a plate having a compound thereon of the formula

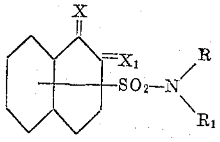

in which X and $X_1$ are selected from the group consisting of $N_2$ and O and are different, R is selected from the group consisting of hydrogen and lower alkyl groups and $R_1$ is an alkyl group; to thereby form a decomposition product in the light struck areas and removing the decomposition product by treatment with a weakly alkaline solution.

34. A process for developing a printing plate which comprises exposing to light under a master a plate having a compound thereon of the formula

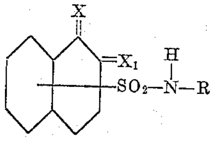

in which X and $X_1$ are selected from the group consisting of $N_2$ and O and are different, and R is an aryl group; to thereby form a decomposition product in the light struck areas and removing the decomposition product by treatment with a weakly alkaline solution.

References Cited in the file of this patent

UNITED STATES PATENTS 2,702,243 Schmidt ---------------- Feb. 15, 1955

FOREIGN PATENTS 854,890 Germany -------------- Dec. 18, 1952

865,108 Germany --------------- Jan. 29, 1953

879,205 Germany -------------- June 11, 1953

904,255 France ------------------ Feb. 19, 1945

OTHER REFERENCES

PB 17547–S3, abstract of German application K 169,-065, released July 28, 1947–10 pages. (Copy in Div. 60.)

UNITED STATES PATENT OFFICE

CERTIFICATE OF CORRECTION

Patent No. 3,046,124

July 24, 1962

Maximilian Paul Schmidt

It is hereby certified that error appears in the above numbered patent requiring correction and that the said Letters Patent should read as corrected below.

Column 2, line 11, for "(1953)" read -- (1933) --; column 17, line 45, for "primidene" read -- pirimidene --; line 47, for "an arylene group" read -- and aryl groups --.

Signed and sealed this 13th day of November 1962.

(SEAL)
Attest:

ERNEST W. SWIDER
Attesting Officer

DAVID L. LADD
Commissioner of Patents